(12) United States Patent
Glenn et al.

(10) Patent No.: US 12,724,091 B2
(45) Date of Patent: Sep. 1, 2026

(54) SOLID-STATE SPIN SENSOR WITH A COMPLIANT HEAD

(71) Applicant: EuQlid, Inc., College Park, MD (US)

(72) Inventors: David Glenn, Cambridge, MA (US); Cole Meisenhelder, Washington, DC (US); Stephen DeVience, Ellicott City, MD (US); Connor Hart, Columbia, MD (US); Aakash Ravi, Laurel, MD (US)

(73) Assignee: EuQlid, Inc., College Park, MD (US)

( * ) Notice: Subject to any disclaimer, the term of this patent is extended or adjusted under 35 U.S.C. 154(b) by 350 days.

(21) Appl. No.: 18/444,685

(22) Filed: Feb. 17, 2024

(65) Prior Publication Data

US 2025/0189603 A1 Jun. 12, 2025

Related U.S. Application Data

(60) Provisional application No. 63/608,302, filed on Dec. 11, 2023.

(51) Int. Cl.

*G01R 33/032* (2006.01)
*G01N 24/00* (2006.01)
*G01R 33/26* (2006.01)

(52) U.S. Cl.

CPC ......... *G01R 33/032* (2013.01); *G01N 24/006* (2013.01); *G01R 33/26* (2013.01)

(58) Field of Classification Search

CPC .. G01R 33/032; G01R 33/1284; G01R 33/24; G01R 33/26; G01N 24/006

See application file for complete search history.

(56) References Cited

U.S. PATENT DOCUMENTS 8,193,808 B2 * 6/2012 Fu ........................ G01R 33/323 324/304
8,547,090 B2 10/2013 Lukin et al.
(Continued)

FOREIGN PATENT DOCUMENTS

WO WO-2024219059 A1 * 10/2024 ............. C09K 11/65
WO WO-2024243522 A1 * 11/2024 ........ A61M 5/14248
(Continued)

OTHER PUBLICATIONS

Machine Translation of WO 2021009203 (Year: 2021).*
(Continued)

*Primary Examiner* — Steven L Yeninas
(74) *Attorney, Agent, or Firm* — Haynes Beffel & Wolfeld LLP; Franklin M. Schellenberg

(57) ABSTRACT

A solid-state spin sensor system for precisely measuring magnetic fields with a compliantly coupled sensor head exhibiting translational and rotational compliance. The sensor includes a color center ensemble in a solid-state substrate for detecting magnetic fields with high spatial resolution. An optical microscope, in conjunction with an optical driving system, facilitates viewing and spin polarization of the color center ensemble. A magnetic field generator ensures biasing of the ensemble for better sensitivity, and a microwave driving system induces spin transitions within the ensemble. Actuation is controlled by a system responsive to force data or image data for precise positioning of the color center ensemble focally and in contact with a sample. The system generates a spatially resolved map of a magnetic field through analysis of fluorescence data. Methods for measuring and mapping fields with fiducials and force feedback are also included, enabling wide-field quantum sensing of irregular surfaces.

19 Claims, 11 Drawing Sheets

(56) References Cited

U.S. PATENT DOCUMENTS

| | | | | |
|---|---|---|---|---|
| 8,885,301 | B1 * | 11/2014 | Heidmann | G11B 5/455 360/323 |
| 8,947,080 | B2 | 2/2015 | Lukin et al. | |
| 9,157,859 | B2 | 10/2015 | Walsworth et al. | |
| 9,391,042 | B2 * | 7/2016 | Golda | H10H 20/80 |
| 9,784,804 | B2 | 10/2017 | Walsworth et al. | |
| 9,807,289 | B2 | 10/2017 | Ning | |
| 10,545,200 | B2 | 1/2020 | Barry et al. | |
| 10,901,062 | B2 | 1/2021 | Walsworth et al. | |
| 11,041,809 | B2 | 6/2021 | Shao et al. | |
| 11,940,399 | B2 | 3/2024 | Walsworth et al. | |
| 12,276,624 | B2 | 4/2025 | Walsworth et al. | |
| 2012/0092972 | A1 * | 4/2012 | Taratorin | G01R 33/032 369/13.29 |
| 2020/0048084 | A1 * | 2/2020 | Acosta | G01R 33/12 |
| 2021/0103011 | A1 * | 4/2021 | Noh | G01R 33/0325 |
| 2021/0239779 | A1 * | 8/2021 | Turner | G01R 33/389 |
| 2021/0255126 | A1 * | 8/2021 | Acosta | G01N 24/12 |
| 2021/0405086 | A1 * | 12/2021 | te Velthuis | G01N 21/21 |
| 2024/0192294 | A1 | 6/2024 | Martynowych et al. | |
| 2025/0237723 | A1 * | 7/2025 | Hai | G01R 33/032 |

FOREIGN PATENT DOCUMENTS

| | | | | |
|---|---|---|---|---|
| WO | WO-2025035090 | A1 * | 2/2025 | G01N 24/006 |
| WO | WO-2025106411 | A1 * | 5/2025 | H05K 7/20272 |

OTHER PUBLICATIONS

Machine Translation of WO 2024219059 (Year: 2024).*

Arunkumar, et al., "Micron-scale sabre-enhanced nv-nmr spectroscopy." arXiv preprint arXiv:2006.03910, Jun. 6, 2020, 12 pages.

Barry, et al., "Sensitivity optimization for NV-diamond magnetometry." Reviews of Modern Physics 92, No. 1, 015004, Jan. 1, 2020, 68 pages.

Doherty et al. "The nitrogen-vacancy colour centre in diamond" arXiv 1302.3288v1, Feb. 14, 2013, 101 pages.

Fong, et al., "High-resolution room-temperature sample scanning superconducting quantum interference device microscope configurable for geological and biomagnetic applications." Review of Scientific Instruments 76, No. 5, 053703, May 1, 2005, 10 pages.

Glenn et al. "Micrometer-scale magnetic imaging of geological samples using a quantum diamond microscope" Geochem. Geophys. Geosyst. 18, Aug. 22, 2017, pp. 3254-3267.

Glenn, et al., "High-resolution magnetic resonance spectroscopy using a solid-state spin sensor." Nature 555, No. 7696, Mar. 15, 2018, pp. 351-354.

Gómez-Varela, et al., "Simultaneous co-localized super-resolution fluorescence microscopy and atomic force microscopy: combined SIM and AFM platform for the life sciences." Scientific reports 10, No. 1, 1122, Jan. 24, 2020, 10 pages.

Gruber, et al., "Scanning confocal optical microscopy and magnetic resonance on single defect centers." Science 276, Jun. 27, 1997, pp. 2012-2014.

Hanson et al., "Polarization and readout of coupled single spins in diamond." Physical Review Letters 97, No. 8, 087601, Aug. 25, 2006, 4 pages.

LeSage et al. "Optical magnetic imaging of living cells" Nature 496, Apr. 24, 2013, Author's Manuscript 15 pages.

Levine et al. "Principles and techniques of the quantum diamond microscope" Nanophotonics 8(11), published Sep. 17, 2019, pp. 1945-1973.

Mamin, et al., "Nanoscale nuclear magnetic resonance with a nitrogen-vacancy spin sensor." Science 339, No. 6119, Feb. 1, 2013, pp. 557-560.

Maze et al. "Nanoscale magnetic sensing with an individual electronic spin in diamond" Nature 455, Oct. 2, 2008, pp. 644-647, (9 pages total with Supplemental Materials).

Pham et al. "Magnetic field imaging with nitrogen-vacancy Ensembles" New Journal of Physics 12, 045021, published Apr. 28, 2011, 13 pages (14 w/ cover sheet).

Schirhagl, et al., "Nitrogen-vacancy centers in diamond: nanoscale sensors for physics and biology." Annual Review of Physical Chemistry 65, No. 1, Apr. 1, 2014, pp. 83-105.

Steinert et al. "High sensitivity magnetic imaging using an array of spins in diamond" Rev. Sci. Instrum 81, 043705, published Apr. 23, 2010 5 pages (6 w/ cover sheet).

Taylor, et al., "High-sensitivity diamond magnetometer with nanoscale resolution." Nature Physics 4, No. 10, Oct. 2008, pp. 810-816.

Turner, et al. "Magnetic field fingerprinting of integrated-circuit activity with a quantum diamond microscope." Physical Review Applied 14, No. 1, 014097, Jul. 1, 2020, 15 pages.

* cited by examiner

FIG. 4C

SOLID-STATE SPIN SENSOR WITH A COMPLIANT HEAD

CROSS-REFERENCE TO RELATED APPLICATIONS

This patent application claims the benefit of priority to U.S. Provisional Patent Application No. 63/608,302, filed on Dec. 11, 2023, the entirety of which is incorporated herein by reference.

TECHNICAL FIELD

The present disclosure relates to quantum sensing and more particularly to quantum sensors utilizing color centers ensembles for precise measurements of physical quantities.

BACKGROUND

Sensing magnetic fields with high spatial resolution is valuable for a wide variety of applications, including material science, biological research, and electronic device analysis. Techniques such as scanning nuclear magnetic resonance (NMR) and magnetic force microscopy (MFM) are commonly used to image magnetic fields. However, the sensitivity and spatial resolution of these methods are often limited by factors such as sensor size, sample preparation, distance from the sample, and interference with the signal.

One promising technology for sensing magnetic fields at high spatial resolutions exploits the quantum properties of color centers in solid-state materials, for example, nitrogen-vacancy (NV) centers in diamond. Color centers, when subjected to a magnetic field, can exhibit changes in their quantum spin states, which can be detected through optically detected magnetic resonance (ODMR). This method can be applied simultaneously across an ensemble of color centers, providing improved magnetic field sensitivity and throughput compared to other techniques.

Despite the significant advancements, challenges still exist when integrating these quantum sensors into a practical system for mapping magnetic fields. Such systems need to align the color center ensemble with the focal plane of an optical microscope to achieve high quality images and provide useful magnetic field information. Moreover, maintaining the sensor's position relative to the sample can be problematic when samples have non-planar, uneven, or oblique surfaces.

Additional challenges involve achieving fine control of mechanical movements, accommodating multi-axis displacements and rotations, and ensuring that the sensor remains in contact with the sample throughout the measurement process, especially when operating over a large sample area. Existing methods and systems fail to effectively address the need for fine control of the quantum sensor's position and orientation concurrently with the demands for high-resolution mapping across the variable geometry of sample surfaces.

Thus, there is a need for an improved quantum sensing system that can provide adaptability and compliance to conform the sensor to various sample geometries without compromising the high-resolution capabilities of solid-state spin sensors.

SUMMARY

In an aspect described herein, a system for measuring a physical characteristic of a sample is disclosed. The system may include an optical microscope, a sensor head, a coupling mechanism, a solid-state substrate, a color center ensemble, an actuator, an optical driving system, and a magnetic field generator. The system may be configured to effect controlled linear displacement and rotation of the sensor head, induce optical transitions in the color center ensemble with an optical driving system, and produce a bias magnetic field within the solid-state substrate with a magnetic field generator.

In other embodiments, a method is provided for measuring a magnetic field. The method may involve placing a solid-state substrate in a first pose, applying a bias magnetic field and an optical driving field, collecting first image data, determining a pose adjustment, controlling an actuator to move the substrate to a second pose, collecting second image data, and generating a spatially resolved map of a magnetic field.

In yet other embodiments, a method is provided for measuring a magnetic field at the surface of a sample. The method may involve placing the sample in a first pose, applying a bias magnetic field and an optical driving field, collecting first image data, determining a first pose adjustment, controlling an actuator to move the sample to a second pose, collecting second image data, and generating a first spatially resolved map of the first magnetic field.

In further embodiments, the disclosed method for measuring a magnetic field at the surface of a sample may involve controlling the actuator to move the sample from the second pose to a third pose, collecting third image data, determining a second pose adjustment, controlling an actuator to move the sample from the third pose to a fourth pose, collecting fourth image data, and generating a second spatially resolved map of a second magnetic field.

BRIEF DESCRIPTION OF DRAWINGS

The foregoing and other objects, aspects, features, and advantages of the disclosure will become more apparent and better understood by referring to the following description taken in conjunction with the accompanying drawings, in which:

FIG. 4C is a top view of a sensor head including an ortho-planar spring;

DETAILED DESCRIPTION

Figure 1A:
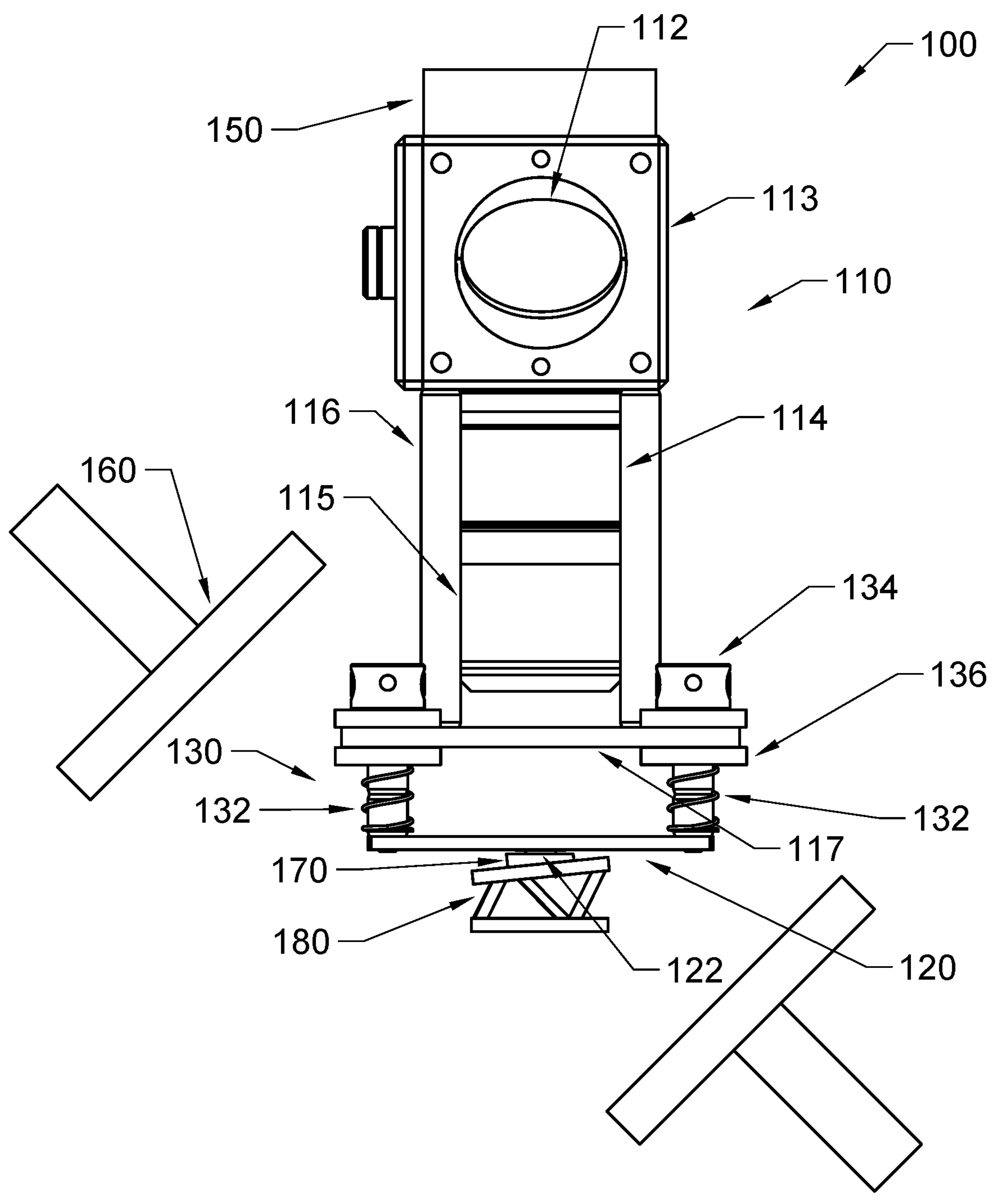
FIG. 1A is a side view of a solid-state spin sensor.

Turning now to the detailed description, FIG. 1A depicts an embodiment of a solid-state spin sensor 100. The solid-state spin sensor 100 leverages the quantum properties of a fluorescent color center ensemble embedded within a solid-state substrate 122 to measure and map magnetic fields produced by a sample 170 with high precision. The color center ensemble is typically situated in a plane near a sample-facing surface of the solid-state substrate 122.

The solid-state spin sensor 100 includes an optical microscope 110, which provides optical components to facilitate imaging of the color center ensemble. In an embodiment the solid-state substrate 122 is a single crystal diamond, and the color centers are nitrogen vacancy (NV) centers. In another embodiment the solid-state substrate 122 is silicon carbide, and the color centers are divacancies.

Figure 2:
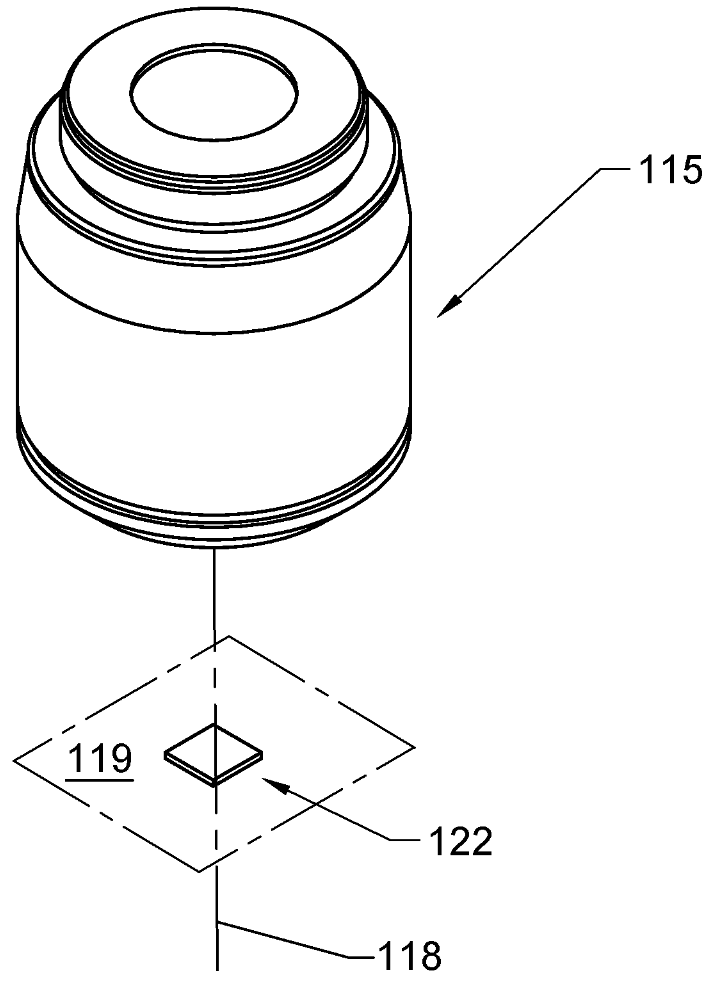
FIG. 2 is a perspective view of an objective and solid-state substrate, illustrating an optical axis and focal plane.

FIG. 2 illustrates an objective 115 of the optical microscope 110 and the solid-state substrate 122. The objective 115 defines an optical axis 118 of the optical microscope 110 and a focal plane 119 of the optical microscope 110. During imaging the ensemble of color centers embedded in the solid-state substrate 122 is positioned and oriented to be substantially coplanar with the focal plane 119 of the optical microscope 110, thereby facilitating high spatial resolution imaging of the light fluoresced by the color center ensemble.

Figure 1B:
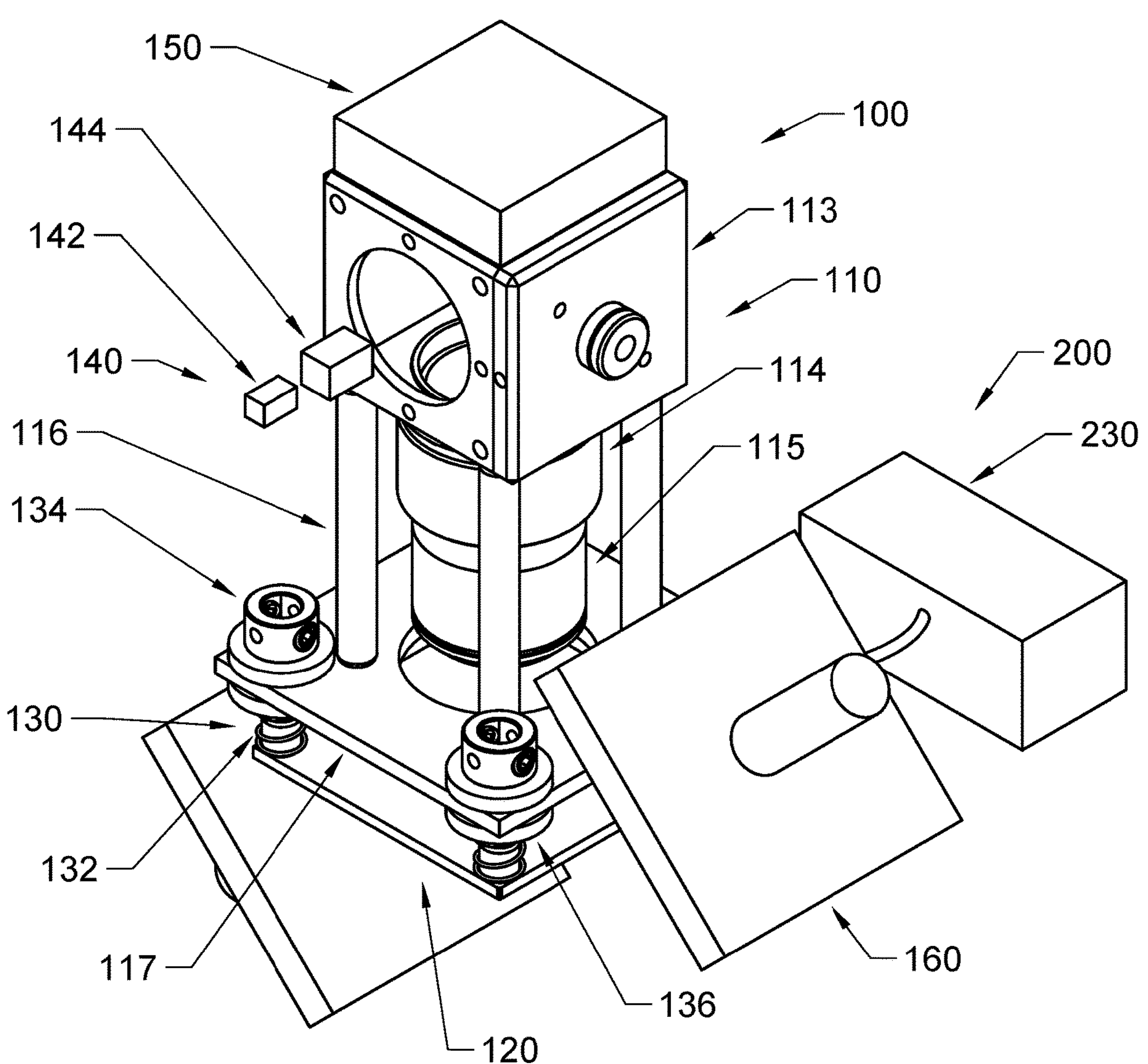
FIG. 1B is a perspective view of a solid-state spin sensor.

Referring now to FIG. 1B, an optical driving system 140 supplies an optical driving field to the color center ensemble that effects optical transitions in the color centers. The optical driving system 140 is typically used to excite the color centers in the color center ensemble for measurement readout and spin initialization. In the depicted embodiment the optical driving system 140 includes a pump laser 142 and an acousto-optic modulator 144 to modulate light emitted by the laser 142, thereby providing enhanced control over the optical excitation of the ensemble of color centers. In an embodiment the laser 142 emits coherent light with a 532 nm wavelength. In another embodiment the optical driving field is generated by a light emitting diode.

A camera 150 captures images of the light fluoresced by the color center ensemble and magnified by the optical microscope 110. The captured image data facilitates the analysis and interpretation of spin states as they correlate to local magnetic fields produced by the sample 170. In an embodiment, fiducial markers are situated substantially coplanar with the color center ensemble, and the camera 150 captures images of the fiducial markers to assist in aligning the color center ensemble with the focal plane 119. Fiducial markers according to this embodiment can be, for example, a set of crosshairs burned into the color center ensemble with a pulsed laser or an array of gold nanoparticles milled into the surface of the solid-state substrate 122 to a depth matching the depth of the color center ensemble.

A dichroic mirror 112 (shown in FIG. 1A) is provided in the optical path between the optical microscope 110 and the camera 150. In the depicted embodiment, the dichroic mirror 112 facilitates the optical pumping of the ensemble of color centers by the optical driving system 140, while enabling the camera 150 to detect fluoresced light from the ensemble of color centers without obfuscation by the excitation light emitted by pump the laser 142. In an embodiment the color center ensemble is excited with green light and fluoresces red light, and thus a longpass dichroic mirror 112 is utilized.

The dichroic mirror 112 is mounted in a cage cube 113, which also includes openings for each of the optical driving system 140, the camera 150, and a parfocal length extender 114. The microscope objective 115 is mounted to the parfocal length extender 114 at the end opposite the cage cube 113. In an embodiment, additional optical filters are situated between the dichroic mirror 112 and camera 150 to further narrow the bandwidth of light reaching the camera 150. A set of mounting rods 116 is utilized to rigidly attach the cage cube 113 to a mounting plate 117, which provides structure to attach a coupling mechanism 130 to optical microscope 110.

Coupling mechanism 130 includes a set of constraining bolts 134 that pass through the mounting plate 117 and attach to a sensor head 120, thereby limiting the maximum distance between mounting plate 117 and sensor head 120. The constraining bolts 134 also pass through helical springs 132 that provide compliance between sensor head 120 and optical microscope 110. Helical springs 132 are kept under compression to avoid slack in the coupling mechanism 130. In the absence of an opposing force, the coupling mechanism 130 biases the sensor head 120 to a position in which the color center ensemble is situated beyond the focal plane 119, with respect to the objective 115.

Forces applied to the sensor head 120 are transmitted through the helical springs 132 to the mounting plate 117. Force sensors 136 are situated in the force transmission path between the helical springs 132 and the mounting plate 117. The force sensors 136 are configured to measure forces experienced by the sensor head 120 and generate force data indicative thereof. In an embodiment, force sensors 136 are strain gauges driven by a bridge.

The sensor head 120 includes the solid-state substrate 122 and interacts closely with a sample 170 under investigation. In certain use cases, the sample 170 may have oblique or non-planar surfaces. The sensor head 120 includes a through-hole 124 (shown in FIG. 3) above the solid-state substrate 122 that enables the excitation and fluoresced light to pass through. The sensor head 120 is configured to maintain proximity between the color center ensemble and the surface of the sample 170 under consideration during a measurement, which allows magnetic fields at the surface of the sample 170 to influence the spin states of the color center ensemble.

Referring again to FIG. 1A, the solid-state substrate 122 is typically maintained in direct contact with the sample 170 during a measurement. In this embodiment the solid-state substrate 122 is rigidly fixed with respect to the sensor head 120. Accordingly, contact between the solid-state substrate 122 and the sample 170 is maintained by a compressive force of the coupling mechanism 130 and an opposing force applied by an actuator 180. In another embodiment, the sensor head 120 includes a locating feature that maintains both contact with the sample 170 and close proximity between the sample 170 and the solid state substrate 122 during a measurement, for example a thin intermediate protective material on a distal surface of the solid state substrate 122.

The actuator 180 moves the sample 170, and thereby the sensor head 120 when the sample 170 is in contact with the sensor head 120. In the depicted embodiment the actuator 180 is a Stewart platform. In another embodiment the actuator 180 is a multi-axis stage with serial kinematics.

In an embodiment a control system 350 (shown in FIG. 5) regulates the actuator 180 using control signals derived from image data collected by the camera 150 and force data collected by the force sensors 136, facilitating automated adjustments of the sample 170 and the sensor head 120, to position and orient the plane of the ensemble of color centers to be coincident with the focal plane 119, while also maintaining contact between the sensor head 120 and the sample 170. In another embodiment the control system 350 primarily regulates the actuator 180 using control signals derived from image data, and force data indicating anomalous or dangerous forces on the sensor head 120 is utilized to halt operation of the actuator 180.

To facilitate accurate measurements, the actuator 180 effects controlled linear displacements and controlled rotations of the sample 170 and sensor head 120 to bring the plane of the color center ensemble into coincidence with the focal plane 119 of the optical microscope 110, while maintaining contact between them. In this context the direction of controlled linear displacements will typically be dominated by a directional component parallel to the optical axis 118 of the optical microscope 110, such that controlled linear displacements of this nature are substantially along the optical axis 118. In one embodiment the actuator 180 effects such controlled linear displacements and controlled rotations in parallel. In another embodiment the actuator 180 effects such controlled linear displacements and controlled rotations serially.

The magnitude and direction of controlled rotations to bring the plane of the color center ensemble into coincidence with the focal plane 119 will typically be determined by the geometry of the sample 170. For example, in the embodiment depicted in FIG. 1A, the sample 170 has a planar surface in contact with the actuator 180 and an opposing oblique planar surface in contact with the solid-state substrate 122. According to this embodiment, a controlled rotation would be a component of a general transformation to bring the plane of the color center ensemble into coincidence with the focal plane 119. A component of a controlled rotation about an axis parallel to the optical axis 118 is typically inoperative to align the orientation of the plane of the color center ensemble with the focal plane 119, thus a controlled rotation aligning the orientation of the plane of the color center ensemble with the orientation of the focal plane 119 is substantially about an axis perpendicular to the optical axis 118.

The plane of the color center ensemble is considered to be brought into coincidence with the focal plane 119 when it is positioned and oriented such that the focus on the color center ensemble or its feature of interest is maximized to the extent practicable, allowing for clear and distinct observation or measurement, as applicable. This positioning and orienting of the color center ensemble are typically within a tolerance range that accounts for a practical resolution limit of the optical microscope 110 and the camera 150. The specific tolerance range may vary depending on the type of optical microscope 110 and camera 150 used and the nature of the observation or measurement being conducted.

Reference to the plane of the color center ensemble does not imply that the color centers in the ensemble are strictly limited to a single crystallographic plane. Rather the term "plane" in this context is understood to describe an arrangement of color centers that is primarily two-dimensional, but may have a slight thickness, taking into account the technical fabrication capabilities at the time of interpretation.

A magnetic field generator 160 applies a bias magnetic field to the color center ensemble. In an embodiment, the magnetic field generator 160 generates a magnetic field configured to facilitate the resolution of the color center magnetic resonances associated with multiple color center axes. In another embodiment, the magnetic field generator 160 generates a magnetic field configured to facilitate the resolution of a color center magnetic resonance associated with a predetermined color center axis. In these embodiments, a color center axis is a crystallographic direction of an individual color center within the lattice structure of the solid-state substrate 122. For example, a nitrogen vacancy color center in a diamond substrate can have one of four color center axes, namely: $[111]$, $[1\bar{1}\bar{1}]$, $[\bar{1}1\bar{1}]$ and $[\bar{1}\bar{1}1]$. In the illustrated embodiment, the magnetic field generator 160 is a set of two permanent magnets. In other embodiments magnetic field generator 160 can employ alternative modes of magnetic field generation, including, for example, electromagnets, superconducting magnets, Halbach arrays, and toroidal magnets.

Figure 3:
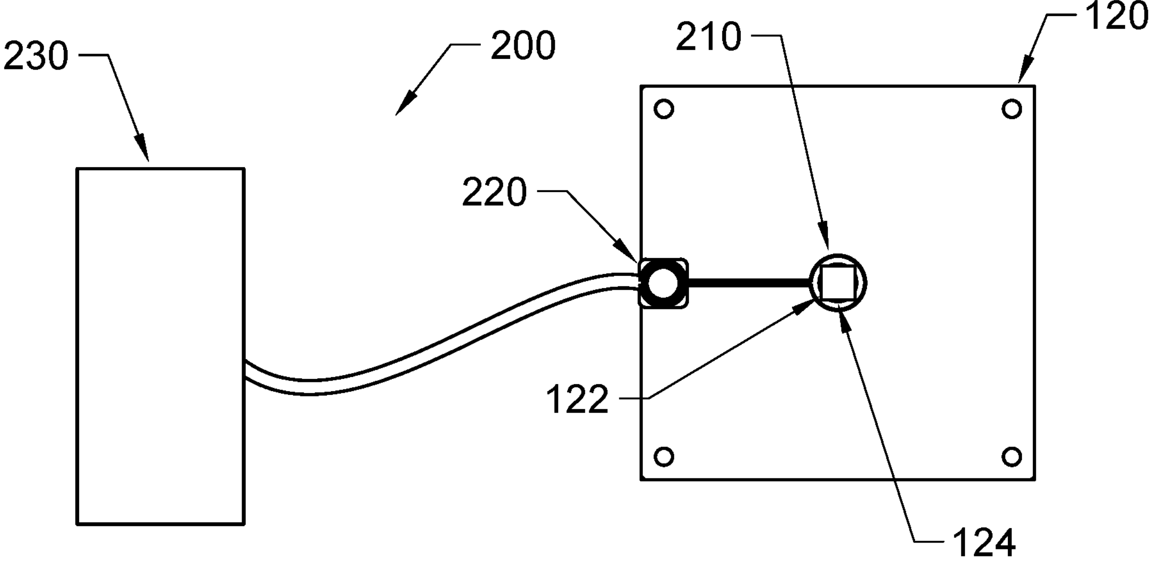
FIG. 3 is a bottom view of a sensor head and microwave driving system.

Referring now to FIG. 3, a microwave driving system 200 provides a microwave driving field to the color center ensemble to induce microwave spin transitions. The microwave driving system 200 includes a microwave trace 210, which is attached to the sensor head 120. The microwave trace 210 can be configured as a stripline, a microstrip, a coplanar waveguide, or other patterns that effectively provide a microwave field to the color center ensemble. In certain embodiments, the pattern may be configured to control the spatial uniformity or gradient of the microwave field that interacts with the color centers, enhancing the precision and spatial resolution of the sensor 100. In the illustrated embodiment, both ends of the microwave trace 210 terminate in a coaxial connector 220.

Microwave driving system 200 further includes a microwave generator 230, which is connected to the microwave trace 210 by way of the coaxial connector 220. The microwave generator 230 delivers a controlled microwave signal to the microwave trace 210. Depending on the application, the controlled microwave signal is typically either a continuous wave or a pulsed microwave field.

Figure 4A:
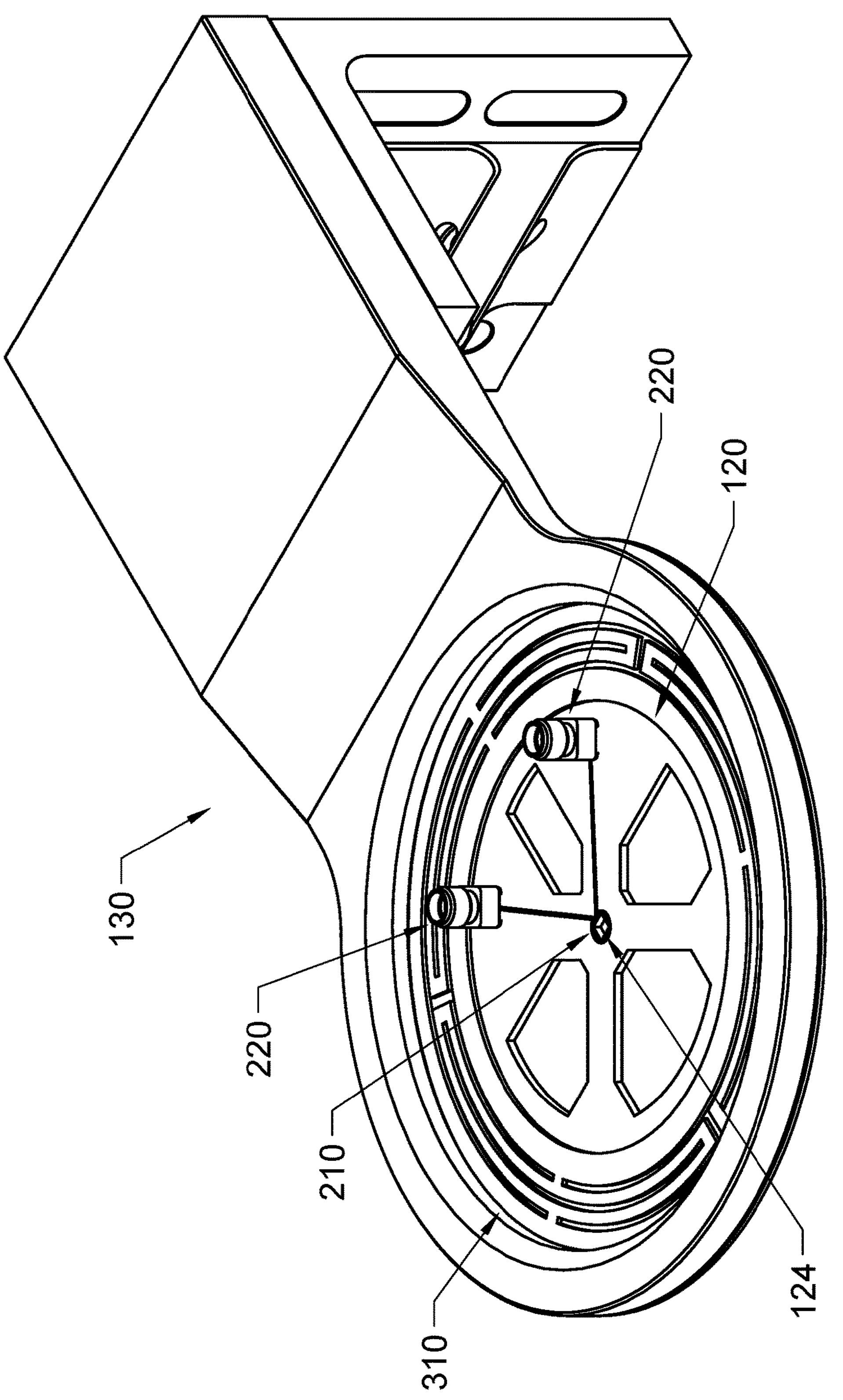
FIG. 4A is a perspective view of a sensor head including an ortho-planar spring.
Figure 4B:
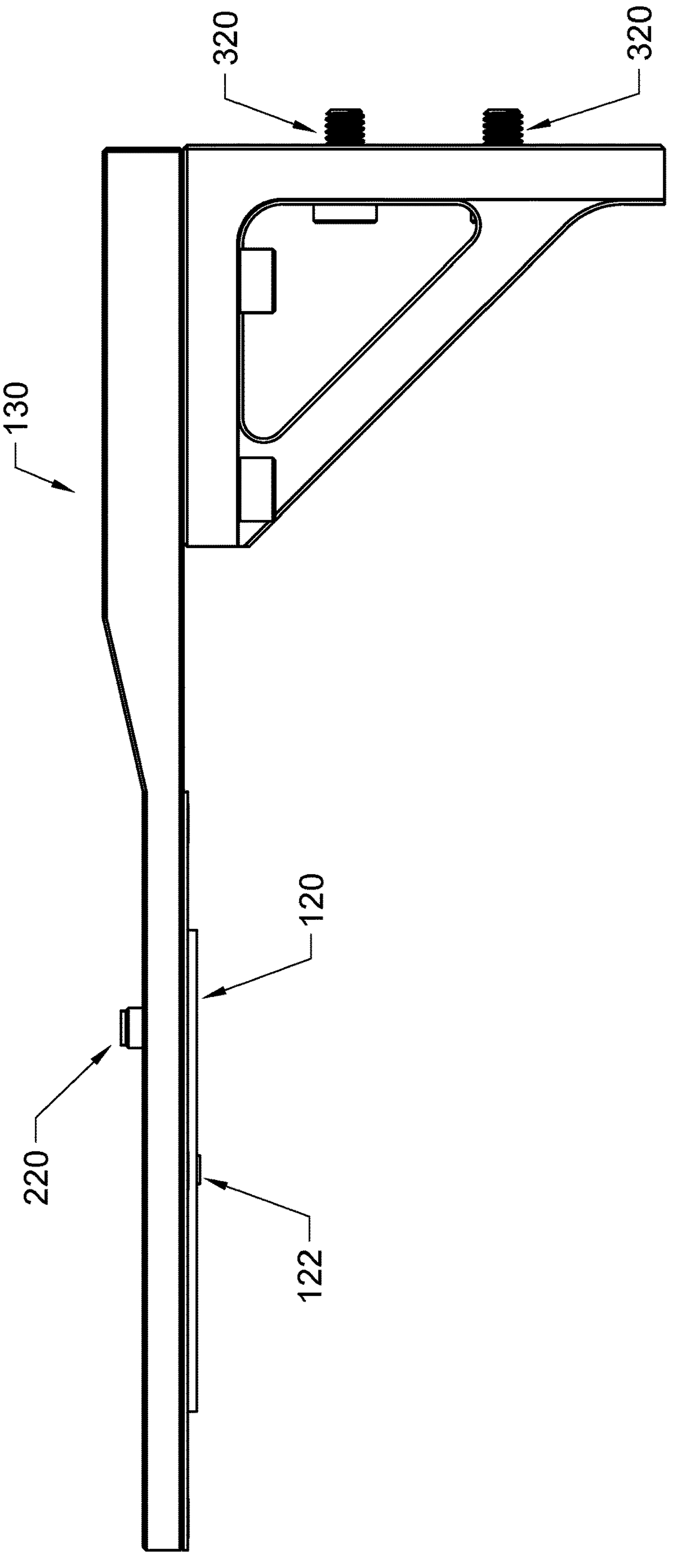
FIG. 4B is a side view of a sensor head including an ortho-planar spring.
Figure 4C:
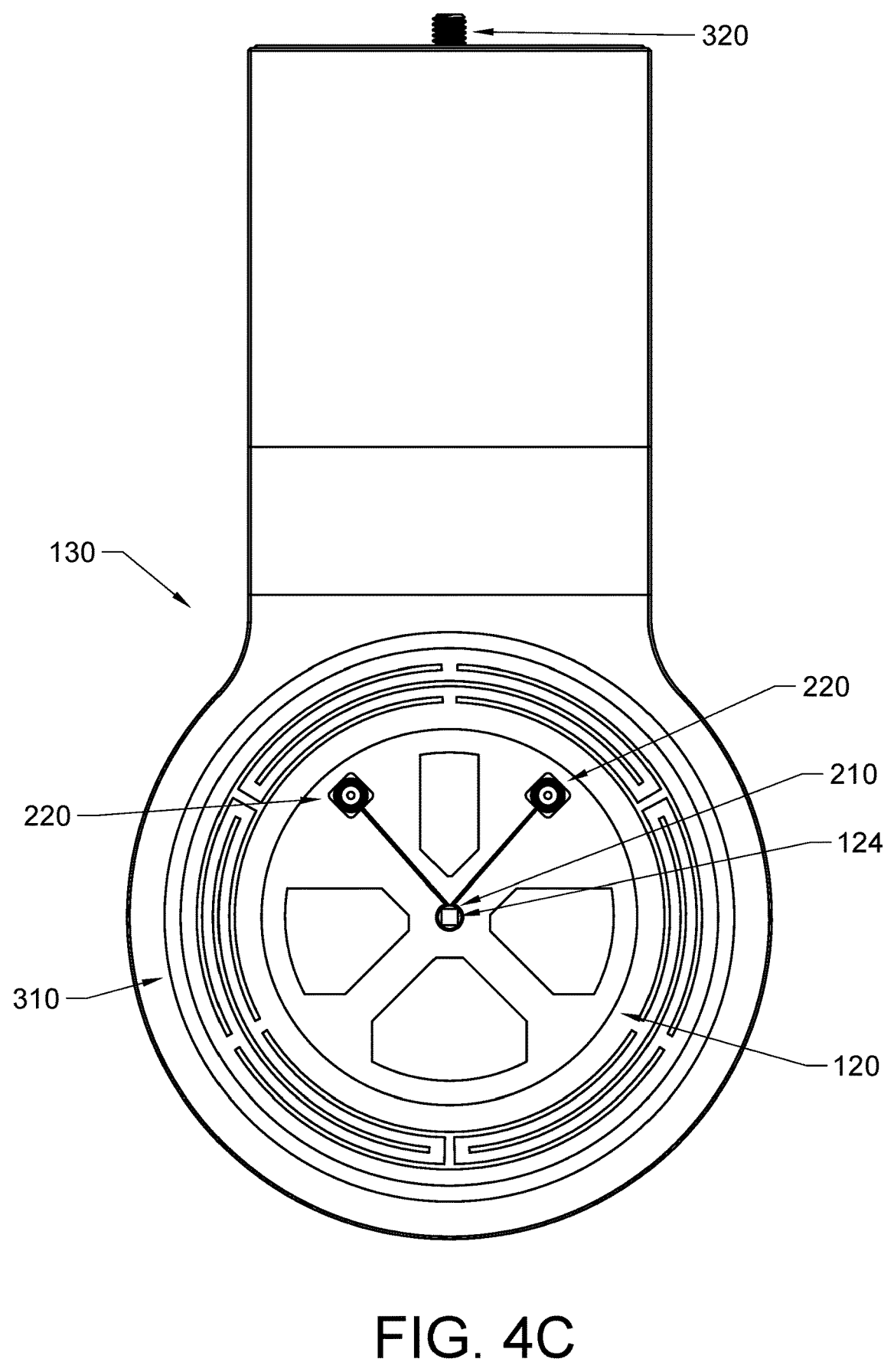

FIGS. 4A, 4B and 4C depict an embodiment in which compliance is provided by an ortho-planar spring 310. As depicted, the coupling mechanism 130 includes an ortho-planar spring 310, which enables the sensor head 120 to translate and rotate with respect to the optical microscope 110 in a controlled and compliant manner. The ortho-planar spring 310 is configured to provide multi-axis compliance allowing for both translational and rotational movements. In this embodiment the ortho-planar spring 310 constrains rotations to axes substantially perpendicular to the optical axis 118 The coupling mechanism 130 further includes coupling bolts 320 to attach the coupling mechanism 130 to the optical microscope 110.

In the depicted embodiment, the sensor head 120 is constructed as a printed circuit board. Each end of the microwave trace 210 is connected to a distinct coaxial connector 220. In an embodiment one of the coaxial connectors 220 serves as an input connection from the microwave generator 230 and the other of the coaxial connectors 220 serves as an output connection to the microwave generator 230. This configuration may improve microwave signal termination, for example by inhibiting signal reflections. In another embodiment the second coaxial connector 220 facilitates enhanced control over the phase of the microwave signal. In other embodiments the second coaxial connector 220 can be utilized to short or ground the microwave trace 210, enabling additional modes of operation.

Figure 5:
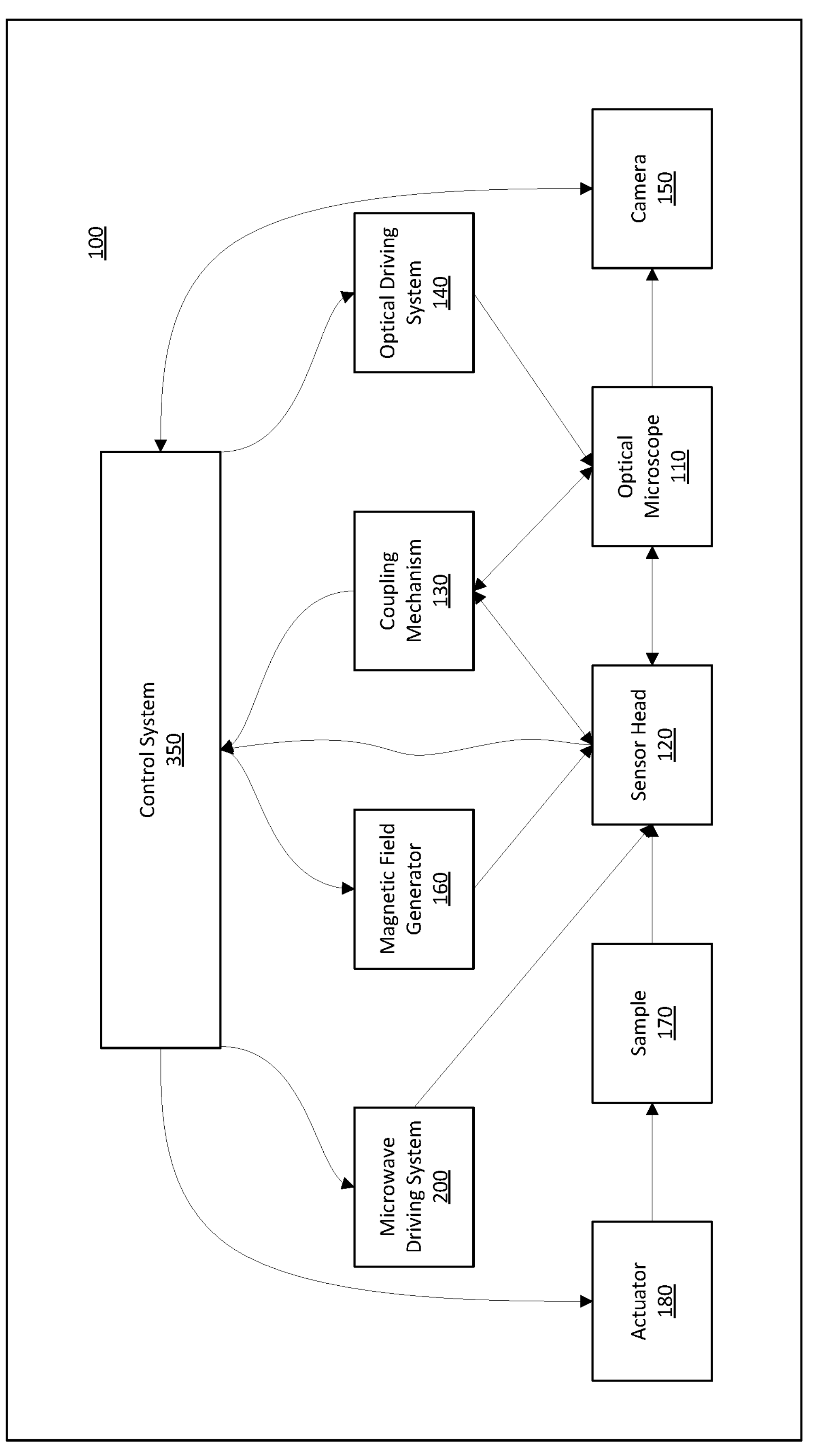
FIG. 5 is a block diagram of a solid-state spin sensor, in accordance with certain embodiments.

FIG. 5 depicts a block diagram illustrating various relationships between components of solid-state sensor 100. In the depicted embodiment, control system 350 is a hub for communication, coordination, processing and control with regard to the various components of solid-state spin sensor 100. In one embodiment, control system 350 is a single computer. In another embodiment, control system 350 is a network of multiple computers and scientific equipment. Depending on the application, control system 350 can be configured to drive various sensing protocols, such as, by way of example, CW ODMR, pulsed ODMR, Ramsey magnetometry, Hahn echo sequences, and T1 relaxometry.

Actuator 180 receives control signals generated by the control system 350, which cause the actuator 180 to apply a force to sample 170. When sample 170 is in contact with sensor head 120 the force is transmitted to sensor head 120 together with a magnetic field associated with the sample 170 that impacts the spin states of the color center ensemble associated with the sensor head 120.

In turn, the force from the actuator 180 is transmitted from sensor head 120 to coupling mechanism 130, and then to the optical microscope 110. Coupling mechanism 130 includes force sensors 136 that measure the force between sensor head 120 and optical microscope 110 and communicate associated force data to control system 350.

Optical driving system 140 receives signals from control system 350 initiating, terminating and adjusting the parameters of the optical driving field for tasks such as measurement readout and optical pumping sequences. On the initiation of optical excitation, light is radiated from the optical driving system 140 to the optical microscope 110 and then illuminates the color center ensemble associated with the sensor head 120 to induce optical transitions.

In a similar fashion microwave driving system 200 receives signals from control system 350 governing the timing and parameters of a microwave driving field. In turn, microwave driving system 200 radiates the microwave driving field to the color center ensemble associated with the sensor head 120 to induce microwave spin transitions.

In the depicted embodiment, the magnetic field generators 160 are electromagnets or another form of magnetic generator capable of selectively controlling the orientation and magnitude of the generated bias magnetic field. As such, in this embodiment the control system 350 directs the magnetic field generator 160 with regard to the parameters of the bias magnetic field, such as, for example, to fine tune a Zeeman splitting.

Control system 350 coordinates these varied signals to effect controlled fluorescence of the color center ensemble conducive to high fidelity optical spin readout. Fluoresced light from the color center ensemble radiates from the sensor head 120 through the optical microscope 110 and associated filters, and into the camera 150, where it is detected by an optical sensor, such as a CMOS or CCD image sensor. Camera 150 transmits the resulting image data to control system 350.

Control system 350 also, by way of controlling the actuator 180, directs the tiling of the wide-field maps from region to region of the sample 170 surface, and stitches the multiple maps associated with different regions of the sample 170 into a unified map of a larger region of interest.

Figure 6:
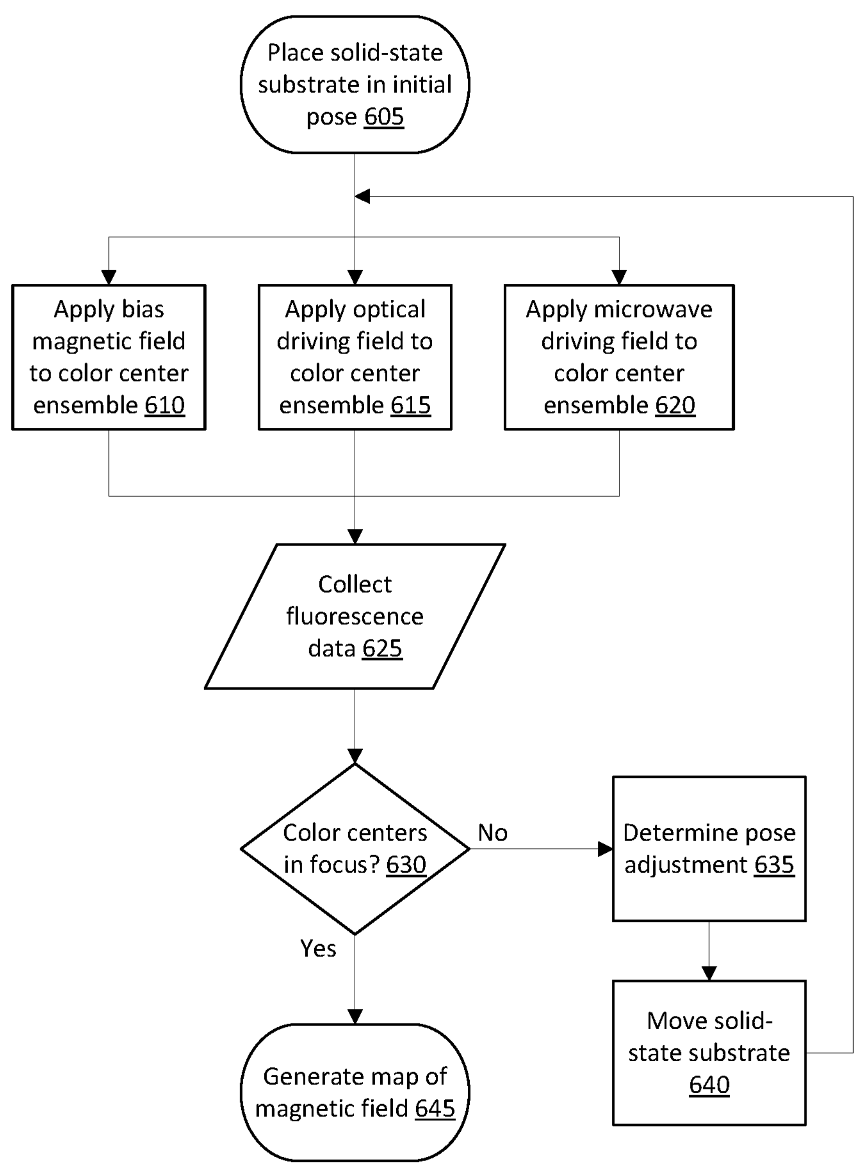
FIG. 6 is a flow chart of a process for generating a map of a magnetic field at a surface of a sample.

FIG. 6 depicts a flow chart of a process for generating a map of a magnetic field at a surface of a sample 170, in accordance with certain embodiments. The process initiates with step 605, where a solid-state substrate 122 embedded with a color center ensemble is placed in a first pose within the optical microscope 110 field of view. The solid-state substrate 122, as part of the sensor head 120, is compliantly attached to the optical microscope 110 via the coupling mechanism 130. Accordingly, this initial pose of the solid-state substrate 122 is typically determined by the position and orientation of a surface of the sample 170 that is either in direct contact with the solid-state substrate 122 or in contact with a locating feature of the sensor head 120 that maintains the solid-state substrate 122 in close proximity with this surface of the sample 170.

At step 610, a bias magnetic field is applied by magnetic field generator 160 to the ensemble of color centers within the solid-state substrate 122. The bias magnetic field is configured in such a way as to facilitate the resolution of the color center magnetic resonances associated with one or more color center axes.

Step 615 involves inducing optical transitions in the color center ensemble through the application of an optical driving field provided by the optical driving system 140. Optical excitation by the optical driving system 140 is used during the optical spin readout of the color center ensemble. In some applications the optical driving system 140 is also used for spin initialization, such as by leveraging state-selective, non-radiative intersystem crossing decay paths to spin polarize NV centers.

In step 620 microwave driving system 200 applies a microwave driving field to the color center ensemble. The microwave driving field is either pulsed or continuous wave, and depending on the application, it is typically used to induce spin transitions, superpositions of spin states or Rabi oscillations.

The application of the bias magnetic field, the optical driving field, and the microwave driving field in steps 610, 615 and 620, respectively, are typically controlled and coordinated by the control system 350 according to a predetermined measurement protocol.

In step 625, one or more images of the color center ensemble fluorescence are collected by camera 150 indicating the fluorescence of the color center ensemble while the solid-state substrate 122 is in the current pose. In some applications a sequence of images of color center ensemble fluorescence is collected while sweeping over a relevant parameter, such as, by way of example, collecting multiple images associated with a series of Ramsey pulse sequences while varying a free precession interval, or collecting multiple images associated with a series of CW ODMR sequences while varying a frequency of the microwave driving field.

In step 630 the one or more images collected in step 625 are evaluated to determine whether the color center ensemble is in focus. In one embodiment the relative fluorescence intensity of the color center ensemble is evaluated to determine whether the plane of the color center ensemble is coincident with the focal plane 119. In one embodiment this involves analyzing the images collected in the immediately preceding step 625 associated with the current pose. In another embodiment this involves analyzing the images collected over multiple iterations of step 625 associated with a sequence of poses.

If it is determined in step 630 that the color center ensemble is not sufficiently in focus, the process proceeds to step 635 wherein a pose adjustment is determined from prior images of color center fluorescence. Again, this may involve analysis of images collected in the immediately preceding step 625 associated with the current pose, or analysis of images collected over multiple iterations of step 625 associated with a sequence of poses. In an embodiment this step 635 is effected by the control system 350 performing an algorithm to maximize the relative fluorescence intensity of the color center ensemble.

In an embodiment the magnetic field generator 160 is configured to generate a bias magnetic field that it is significantly stronger than the magnetic field associated with sample 170 and has a known and non-uniform distribution outside of the focal plane 119. According to this embodiment, step 630 involves characterizing the uniformity of the distribution of the bias magnetic field at the color center ensemble to determine if the color center ensemble coincides with the focal plane 119. The bias magnetic field at the color center ensemble can be measured using various methods, such as, by way of example, measuring the Ramsey phase accumulation at multiple locations within the color center ensemble. If it is determined that the color center ensemble is not in focus, in step 635 the measured distribution of the bias magnetic field is compared to the known spatial distribution of the bias magnetic field to determine an appropriate pose adjustment to bring the color center ensemble into coincidence with the focal plane 119.

Following this, in step 640, the actuator is controlled to move the solid-state substrate 122 from the current pose to a new pose in accordance with the pose adjustment determined in step 635. The compliance between the sensor head 120 and the optical microscope 110 enables continued contact between the sample 170 and the solid state substrate 122, or the sensor head 120 locating feature, during the movement of the solid-state substrate from the current pose to the new pose. In an embodiment force data generated by the force sensors 136 is monitored during step 640, and operation of the actuator 180 is halted if the force data indicates forces between the sensor head 120 and the optical microscope 110 have exceeded a predetermined threshold, or upon a sudden increase in force measurements.

The process then returns to the parallel steps 610, 615 and 620 and repeats until it is determined in step 630 that the color center ensemble is in focus. When the determination is made that the color center ensemble is in focus, control system 350 utilizes the images of the color center ensemble fluorescence collected in the most recent iteration of step 625, together with information relating to the current protocol, physical properties of the color center ensemble, and so forth, to generate a spatially resolved map of the magnetic field associated with the region of the sample 170 in close proximity to the color center ensemble. This map typically indicates the gradient and intensity of the sample magnetic field that was present at the time of imaging across the ensemble of color centers. In an embodiment, control system 350 also uses images of the color center ensemble fluorescence collected in multiple previous iterations of step 625 to enhance the generated map.

The spatially resolved map produced in this manner can be employed for various applications, including, by way of example, defect detection in material sciences, mapping neural signals in biological samples, and fault detection in integrated circuits.

Figure 7:
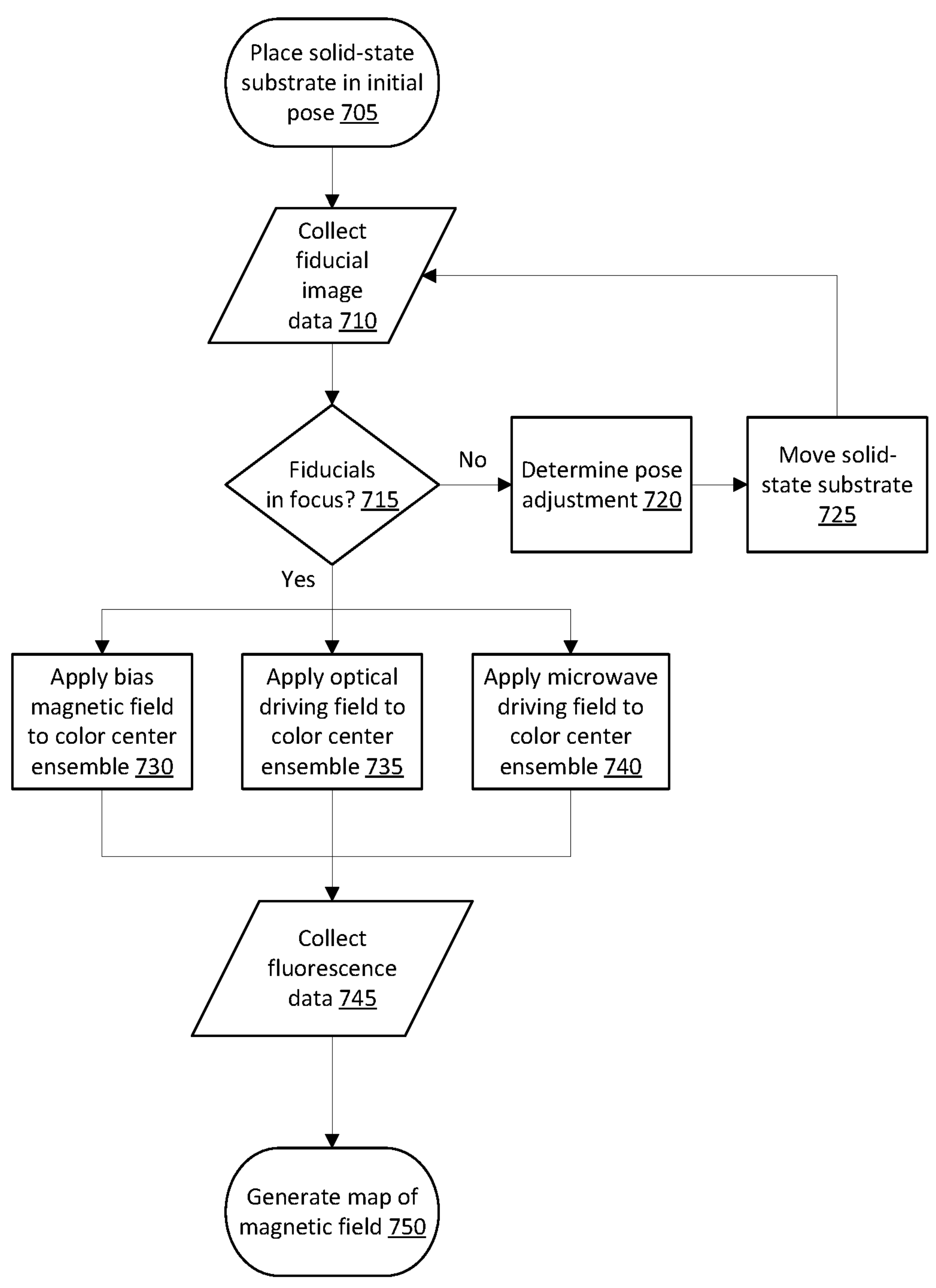
FIG. 7 is a flow chart of a process for generating a map of a magnetic field at a surface of a sample utilizing fiducials.

Reference is now made to FIG. 7, which is a flow chart of a process for generating a map of a magnetic field at a surface of a sample 170 utilizing fiducials in accordance with certain embodiments.

The process begins at step 705, where a solid-state substrate 122 is placed into an initial pose in which the solid-state substrate 122 is in contact with the sample 170. In this embodiment, the solid-state substrate 122 contains a pre-determined pattern of fiducial markers, which are substantially coplanar with the embedded color center ensemble.

At step 710, one or more images of the fiducial markers are collected. Depending on the material and construction of the fiducial markers, optical filters may be added or removed, and an alternative source of illumination may be provided, to isolate and enhance the light reflected or emitted by the fiducial markers. In another embodiment fiducial markers are selected to fluoresce under the same conditions and at the same wavelength as the color center ensemble to make efficient use of optical components.

In an embodiment, the images collected in step 710 also include color center ensemble fluorescence. In this embodiment, image data associated with the color center ensemble fluorescence is used to supplement the image data associated with the fiducial markers to increase the fidelity of steps 715 and 720.

In another embodiment step 710 includes the application of image processing techniques to detect and isolate the fiducial markers in the collected images. This includes, for example, edge detection, pattern recognition and other computer vision techniques and algorithms.

In step 715 the images collected in step 710 are evaluated to determine whether the array of fiducial markers, and accordingly the color center ensemble, is in focus. In one embodiment, calibration data is collected prior to the measurement and used in conjunction with the known fiducial marker pattern to determine the pose of the fiducial markers relative to the focal plane 119.

According to this embodiment, if the pose of the color center ensemble is not coincident with the focal plane 119, a pose adjustment is calculated in step 720 by using the calibration data together with the images of the fiducial markers collected in step 710. In another embodiment force data associated with one or more prior solid-state substrate 122 poses is utilized in determining the pose adjustment in step 720.

In step 725 the pose adjustment calculated in step 720 is used to generate control signals to regulate the actuator 180 and effect movement of the solid-state substrate 122 in accordance with the calculated pose adjustment.

When the fiducials, and accordingly the color center ensemble, are determined to be in focus in an iteration of step 715, the process proceeds to the parallel steps 730, 735 and 740.

At step 730 a bias magnetic field is applied by magnetic field generator 160 to the ensemble of color centers within the solid-state substrate 122 to facilitate the resolution of the color center magnetic resonances associated with one or more color center axes.

In step 735 the optical driving system 140 illuminates the color center ensemble with an optical driving field to induce optical transitions in the color center ensemble.

In step 740 microwave driving system 200 applies a microwave driving field to the color center ensemble to induce microwave spin transitions, superpositions of spin states or Rabi oscillations.

In step 745, one or more images of the color center ensemble fluorescence are collected by camera 150 while the color center ensemble is in focus.

Step 750 involves generating a spatially resolved magnetic field map based on the collected fluorescence data, which provides information about the magnetic field at a surface of the sample in the region proximate to the color center ensemble.

Figure 8:
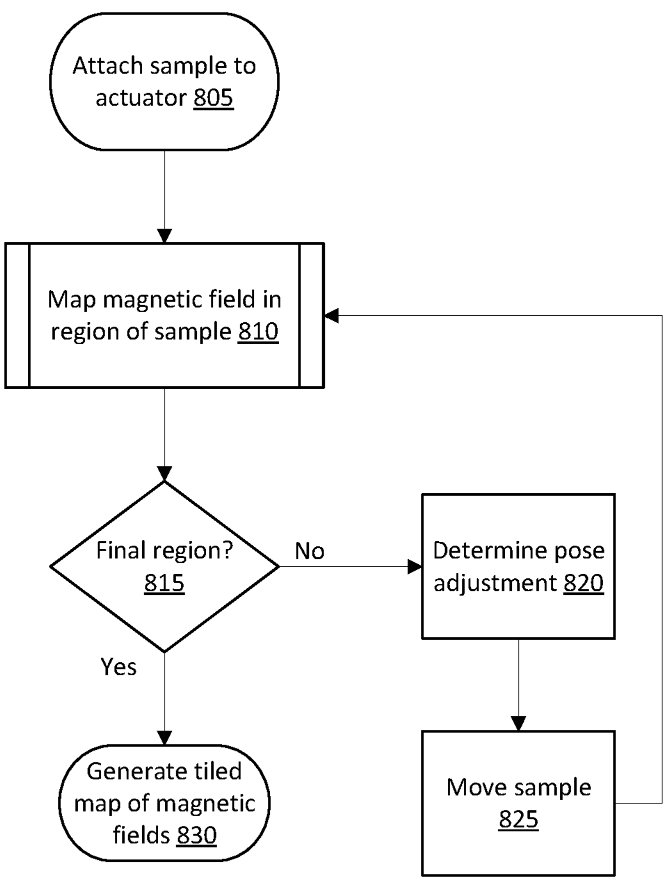
FIG. 8 is a flow chart of a process for generating a tiled map of a magnetic field at a surface of a sample.

FIG. 8 illustrates a process for generating a set of magnetic field maps associated with a number of regions on the surface of a sample 170 and aggregating that set maps by stitching them together into a tiled map of a magnetic field associated with the union of such regions.

The process begins in step 805 by attaching a sample 170 to the actuator 180. Depending on the characteristics of the sample 170 and actuator 180, the mechanism to secure the sample 170 could include, for example, friction, clamps, bolts, or any other mechanism sufficient to keep the sample 170 seated on the actuator 180.

Step 810 is a subprocess for generating a map of a magnetic field associated with a localized region of the sample 170. Both the process set forth in FIG. 6 and the process set forth in FIG. 7 are appropriate subprocesses for step 810.

At step 815, a determination is made as to whether the mapping of an entire predetermined region of interest relative to the sample 170 has been completed. In an embodiment previously collected image data, force data and magnetic field maps are utilized to estimate a boundary of the sample 170 and determine mapping coverage within the estimated boundary. If the estimated boundary is closed and the mapping coverage exceeds a predetermined coverage threshold the process proceeds to step 830, otherwise the process proceeds to step 820.

In step 820 a pose adjustment effective to bring a new region of the sample 170 into contact with the solid-state substrate 122 is determined. This determination is based on the current estimated boundary, the current mapping coverage, and the predetermined coverage threshold, where the third factor influences the preference for overlap in mapped regions relative to gaps between mapped regions. In an embodiment the output of step 820 is a determined linear displacement along an axis substantially perpendicular to the optical axis 118.

In step 825 the actuator 180 first effects a linear displacement away from the optical microscope 110 substantially parallel to the optical axis 118 until the sample 170 is no longer in contact with the solid-state substrate 122. In an embodiment the disengagement of the sample 170 from the solid-state substrate 122 is determined by the force data generated by the force sensors 136. In particular, disengagement is assumed when the force data is no longer responsive to motion of the actuator 180. After disengagement, the actuator 180 effects the linear displacement determined in step 820. The actuator 180 then effects a third linear displacement towards the optical microscope 110 substantially along the optical axis 118 until the sample 170 reengages the sensor head 120, which is indicated by a resumption of force sensor 136 response to actuator 180 motion.

Once a new region of the sample 170 has established contact with the solid-state substrate 122, the process returns to step 810. When a determination is made that a final region has been mapped in an iteration of step 815, the process proceeds to step 830.

In step 830, the control system 350 aggregates the magnetic field maps generated for the individual, and potentially overlapping, regions of the sample 170 generated in iterations of subprocess 810 into a single, unified magnetic field map. The control system 350 employs image stitching techniques, such as feature matching, homography, and blending algorithms, to generate a coherent and continuous magnetic field representation across a union of the sampled regions.

The resultant tiled magnetic field map is a composite that provides spatially resolved information on the magnetic field distribution across a broad area of the sample 170.

Although exemplary embodiments of the present disclosure have been described in detail, those skilled in the art will appreciate that various changes, substitutions and improvements disclosed herein may be made without departing from the spirit and scope of the disclosure in its broadest form. By way of example, and without limiting the generality of the foregoing, the disclosed systems and methods relating to the measurement of a magnetic field associated with a sample 170 may be applied measuring other physical properties, such as electric field and temperature, without departing from the essence of the disclosure.

The description and drawings in the present disclosure should not be read as implying that any particular element, step, function or advantage is an essential element that must be included in the claim scope. The scope of patented subject matter is defined only by the allowed claims.

What is claimed is:

1. A system for measuring a physical characteristic of a sample comprising:

an optical microscope, wherein an optical axis and a focal plane are associated with the optical microscope;

a sensor head;

a coupling mechanism comprising an ortho-planar spring, the coupling mechanism configured for compliant attachment of the sensor head to the optical microscope, wherein the coupling mechanism mediates translational compliance of the sensor head along the optical axis and rotational compliance of the sensor head about a rotation axis perpendicular to the optical axis;

a solid-state substrate attached to the sensor head;

a color center ensemble embedded in the solid-state substrate;

an actuator configured to effect a first controlled linear displacement of the sensor head substantially along the optical axis, and a controlled rotation of the sensor head substantially about the rotation axis;

an optical driving system configured to induce optical transitions in the color center ensemble; and a magnetic field generator configured to produce a bias magnetic field within the solid-state substrate.

2. The system of claim 1 further comprising a microwave driving system, wherein the microwave driving system is configured to induce microwave spin transitions in the color center ensemble, and wherein the microwave driving system comprises a trace attached to the sensor head.

3. The system of claim 1, wherein the bias magnetic field has a predetermined strength and orientation at the focal plane configured to resolve magnetic resonances of the color center ensemble with respect to a plurality of color center axes.

4. The system of claim 1, wherein the first controlled linear displacement and the controlled rotation bring the color center ensemble into coincidence with the focal plane.

5. The system of claim 4, wherein the sensor head maintains contact with the sample throughout the first controlled linear displacement and the controlled rotation.

6. The system of claim 5, wherein the actuator is configured to effect the first controlled linear displacement and the controlled rotation by moving the sample relative to the optical microscope.

7. The system of claim 6, wherein the actuator is further configured to effect a second controlled linear displacement of the sensor head along a direction substantially perpendicular to the optical axis.

8. The system of claim 1 further comprising a force sensor configured to measure a compressive force between the microscope and the sensor head.

9. The system of claim 8 further comprising a control system configured to receive force data from the force sensor indicative of the compressive force, wherein the control system is further configured to generate controls signals derived from the force data to regulate the actuator.

10. The system of claim 1, wherein
the solid-state substrate is a single crystal diamond, and wherein the color center ensemble is an ensemble of nitrogen vacancies.

11. The system of claim 1 further comprising:
a camera configured to capture image data relating to the color center ensemble from the optical microscope; and
a control system configured to receive the image data, wherein:
the control system is configured to generate control signals derived from the image data, and
the control signals regulate the actuator.

12. The system of claim 1 further comprising:
a plurality of fiducial markers substantially coplanar with the color center ensemble;
a camera configured to capture fiducial image data relating to the plurality of fiducial markers from the optical microscope; and
a control system configured to receive the fiducial image data, wherein:
the control system is configured to generate control signals derived from the fiducial image data, and
the control signals regulate the actuator.

13. The system of claim 1 further comprising:
a force sensor configured to measure a compressive force between the microscope and the sensor head, wherein the force sensor generates force data indicative of the compressive force;
a camera configured to capture image data relating to the color center ensemble from the optical microscope; and
a control system configured to receive the image data and the force data, wherein:
the control system is configured to generate control signals derived from the image data and the force data, and
the control signals regulate the actuator.

14. A method for measuring a magnetic field comprising:
placing a solid-state substrate in a first pose that is within view of an optical microscope, the optical microscope coupled to a sensor head with an ortho-planar spring, and wherein the solid-state substrate comprises an embedded ensemble of color centers;
applying a bias magnetic field to the ensemble of color centers;
applying an optical driving field to induce an optical transition in the ensemble of color centers;
collecting first image data indicating fluorescence of the ensemble of color centers when the solid-state substrate is in the first pose;
determining a pose adjustment derived from the first image data;
controlling an actuator to move the solid-state substrate from the first pose to a second pose in accordance with the pose adjustment;
collecting second image data when the solid-state substrate is in the second pose, wherein the second image data comprises fluorescence data relating to the fluorescence of the ensemble of color centers when the solid-state substrate is in the second pose; and
generating a spatially resolved map of a magnetic field coincident with the ensemble of color centers based on the fluorescence data.

15. A method for measuring a magnetic field at a surface of a sample comprising:
placing the sample in a first pose such that the sample is in contact with a sensor head, wherein the sensor head comprises a solid-state substrate with an embedded ensemble of color centers and is coupled to an optical microscope with an ortho-planar spring;
applying a bias magnetic field to the ensemble of color centers;
applying an optical driving field to induce an optical transition in the ensemble of color centers;
collecting first image data from the optical microscope when the sample is in the first pose;
determining a first pose adjustment derived from the first image data;
controlling an actuator in accordance with the first pose adjustment to move the sample from the first pose to a second pose while maintaining contact between the sample and the sensor head;
collecting second image data from the optical microscope, the second image data comprising first fluorescence data relating to the fluorescence of the ensemble of color centers when the sample is in the second pose, wherein the first fluorescence data is indicative of a first spatial distribution of a physical property associated with a first region of the sample; and
generating a first spatially resolved map of a first magnetic field based on the first fluorescence data.

16. The method of claim 15 further comprising:
generating force data indicative of a compressive force between the sensor head and the optical microscope while moving the sensor head from the first pose to the second pose; and
altering the first pose adjustment based on the force data.

17. The method of claim 15 further comprising extracting fiducial data from the first image data, wherein:
the optical microscope defines a focal plane,
the fiducial data is indicative of an alignment of a plurality of fiducial markers relative to the focal plane, and
the pose adjustment is derived from the fiducial data.

18. The method of claim 15 further comprising:
controlling the actuator to move the sample from the second pose to a third pose such that the sample is in contact with the sensor head, wherein:
the sample is in a first position relative to the sensor head when the sample is in the first pose,
the sample is in a second position relative to the sensor head when the sample is in the third pose, and
the first position is distinct from the second position;
collecting third image data from the optical microscope when the sample is in the third pose;
determining a second pose adjustment derived from the third image data;
controlling an actuator in accordance with the second pose adjustment to move the sample from the third pose to a fourth pose while maintaining contact between the sample and the sensor head;
collecting fourth image data from the optical microscope, the fourth image data comprising second fluorescence data relating to the fluorescence of the ensemble of color centers when the sample is in the fourth pose, wherein the second fluorescence data is indicative of a second magnetic field associated with a second region of the sample; and
generating a second spatially resolved map of a second magnetic field associated with the second region based on the second fluorescence data.

19. The method of claim 18 further comprising
stitching the first spatially resolved map together with the second spatially resolved map to create a third spatially resolved map of a third magnetic field associated with a union of the first region and the second region.

* * * * *